US008587750B2

(12) United States Patent
Tsuda

(10) Patent No.: US 8,587,750 B2
(45) Date of Patent: Nov. 19, 2013

(54) DISPLAY DEVICE

(75) Inventor: Kazuhiko Tsuda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 169 days.

(21) Appl. No.: 13/063,023

(22) PCT Filed: Aug. 26, 2009

(86) PCT No.: PCT/JP2009/064873
§ 371 (c)(1),
(2), (4) Date: Mar. 9, 2011

(87) PCT Pub. No.: WO2010/035606
PCT Pub. Date: Apr. 1, 2010

(65) Prior Publication Data
US 2011/0164210 A1    Jul. 7, 2011

(30) Foreign Application Priority Data

Sep. 25, 2008  (JP) .................................. 2008-246107

(51) Int. Cl.
*G02F 1/1335* (2006.01)
(52) U.S. Cl.
USPC .......................................................... 349/96
(58) Field of Classification Search
None
See application file for complete search history.

(56) References Cited

U.S. PATENT DOCUMENTS

| 7,468,770 B2 * | 12/2008 | Okumura ...................... 349/123 |
| 2002/0047969 A1 | 4/2002 | Minakuchi | |
| 2002/0063829 A1 * | 5/2002 | Manabe et al. ............... 349/117 |
| 2007/0131928 A1 | 6/2007 | Kwak | |
| 2007/0146578 A1 * | 6/2007 | Yabuta et al. .................. 349/96 |
| 2009/0115942 A1 * | 5/2009 | Watanabe ....................... 349/96 |

FOREIGN PATENT DOCUMENTS

| JP | 03107820 A * | 5/1991 |
| JP | 10-048625 | 2/1998 |
| JP | 10-301099 | 11/1998 |
| JP | 2002-072214 | 3/2002 |
| JP | 2002-148592 | 5/2002 |
| JP | 2002-311239 | 10/2002 |
| JP | 2004-125886 | 4/2004 |
| JP | 2007-165276 | 6/2007 |
| JP | 2007-310161 | 11/2007 |

OTHER PUBLICATIONS

International Search Report for PCT/JP2009/064873, mailed Oct. 6, 2009.

* cited by examiner

*Primary Examiner* — Thanh-Nhan P Nguyen
(74) *Attorney, Agent, or Firm* — Nixon & Vanderhye P.C.

(57) ABSTRACT

The present invention provides a display device which can reduce reflected light reflected on the respective surfaces of a display panel and a protective plate, even if the protective plate is disposed on the surface of the display panel, without employing a complicated structure and without degrading display quality. The display device includes: a display panel; and a protective plate disposed facing the display panel. The protective plate has a protective base material and a first polarizer, the display panel has a second polarizer of which a polarization axis is parallel to that of the first polarizer, and light passing between the first polarizer and the second polarizer is linearly polarized light.

8 Claims, 7 Drawing Sheets

"Prior Art"

DISPLAY DEVICE

This application is the U.S. national phase of International Application No. PCT/JP2009/064873 filed 26 Aug. 2009 which designated the U.S. and claims priority to Japanese Application No. 2008-246107 filed 25 Sep. 2008, the entire contents of each of which are hereby incorporated by reference.

TECHNICAL FIELD

The present invention relates to a display device, and more particularly to a display device in which a protective plate for protecting a display panel is provided for the display panel.

BACKGROUND ART

For a surface of a display panel, such as a cathode ray tube (CRT) display panel, liquid crystal display (LCD) panel, plasma display panel (PDP) and electro-luminescence (EL) display panel, various functions, including a scratch prevention function and a contamination prevention function, are required. Liquid crystal alignment defects may be generated when, for example, the liquid crystal display panel is subjected to an external impacts. Therefore in order to prevent scratches and contamination, and protect from an external impact, in some cases a protective plate is disposed on the surface of the display panel.

If such a protective plate is disposed on the surface of the display panel, light is reflected not only on the surface of the liquid crystal display panel, but also on the surface of the protective plate, and a display may not be viewed well in a bright indoor location or an outdoor location. In particular, in the case when structure of the protective plate becomes complicated by attaching such a function as a touch panel thereto, light reflection quantity tends to increase because of the structure of the protective plate. To prevent this, means for reducing light reflection from the protective plate by disposing a circularly polarizing plate for the protective plate has been disclosed (e.g. see Patent Documents 1 to 3). The principle of reducing reflected light by the circularly polarizing plate is as follows.

FIG. 8 is a cross-sectional view schematically depicting a configuration of a conventional liquid crystal display device on which a circularly polarizing plate is disposed for a protective plate. As FIG. 8 shows, an example of means for reducing reflection of light due to the structure of the protective plate is to use a liquid crystal display device having a touch panel with a circularly polarizing plate 101 on the surface of the liquid crystal panel. In FIG. 8, the touch panel with a circularly polarizing plate 101 is disposed on the observation surface side of the liquid crystal panel 102. The liquid crystal panel 102 has a lower polarizer 133, lower substrate 122, liquid crystal layer 151, upper substrate 121 and upper polarizer 132, which are stacked in this order toward the observation surface. The touch panel with a circularly polarizing plate 101 is disposed on the observation surface side of the liquid crystal panel 102, and includes a touch panel 111, a λ/4 plate 181 and a polarizer 131, which are stacked in this order toward the observation surface. The light that has passed through the stack structure of the polarizer 131 and the λ/4 plate 181 is converted to a circularly polarized light. The stack structure of the polarizer 131 and λ/4 plate 181 is normally called a circularly polarizing plate 191.

The external light (natural light) entered the touch panel with a circularly polarizing plate 101 passes through the polarizer 131 first, and is then converted to linearly polarized light vibrating in one direction, and then passes through the λ/4 plate 181, so that the linearly polarized light is converted to circularly polarized light rotating in one direction (the rotation of the circularly polarized light at this time is assumed to be counterclockwise when viewed from the direction facing the traveling direction). Some of the components, out of the converted circularly polarized light, are reflected on the surface of the touch panel 111 and the surface of the liquid crystal panel 102, and travel backward toward the outside. The circularly polarized light reflected on the surface of the touch panel 111 and the surface of the liquid crystal panel 102 travels in a reverse direction while maintaining the same rotating direction, so it becomes clockwise circularly polarized light when viewed from a direction facing the travel direction. The clockwise circularly polarized light passes through the λ/4 plate again, and is converted to the linearly polarized light again. The vibration direction of the converted linearly polarized light changes to a direction orthogonal to the vibration direction of the incident linearly polarized light. Since the polarizer allows transmitting only light vibrating in one predetermined direction (in this case the vibrating direction of incident linearly polarized light), the light reflected on the surface of the liquid crystal panel 102 in the touch panel 111 is blocked by the polarizer 131, is not emitted to the outside, and is not recognized as reflected light.

In this way, the configuration of the circularly polarizing plate 191 permits the reduction of the reflected light, but the above-mentioned configuration alone is insufficient for the light that has passed through the liquid crystal panel 102. This is because the light that has passed through the liquid crystal panel 102 passes through the λ/4 plate 181 only once, after passing through the liquid crystal panel 102, and by passing through the polarizer 131 after passing through the λ/4 plate 181, transmitted light is greatly reduced and transmittance, which is critical for a display, drops. Therefore according to a conventional liquid crystal display device, a λ/4 plate 182 having an optical axis in a direction orthogonal to the optical axis of the λ/4 plate 181 of the touch panel with a circularly polarizing plate 101, is disposed between the liquid crystal panel 102 and the touch panel 101 with a circularly polarizing plate in the liquid crystal display device, whereby the phase difference of transmitted light is adjusted, and light that has passed through the liquid crystal panel 102 can be emitted to the outside, without dropping the transmittance due to the polarizer 131 of the touch panel with a circularly polarizing plate 101. This principle is also used for an organic EL display panel (e.g. see Patent Document 4).

[Patent Document 1] Japanese Kokai Publication No. H10-48625
[Patent Document 2] Japanese Kokai Publication No. 2002-72214
[Patent Document 3] Japanese Kokai Publication No. 2002-148592
[Patent Document 4] Japanese Kokai Publication No. 2002-311239

However in order to add a function of the circularly polarizing plate to the protective plate, a new λ/4 plate must be fabricated, whereby a certain degree of antireflection effect may be obtained, but adding the λ/4 plate may cause such problems as deterioration of the field of view from the diagonal direction with respect to the display surface of the display panel, and the generation of a certain tint on the display.

DISCLOSURE OF THE INVENTION

With the foregoing in view, it is an object of the present invention to provide a display device which can reduce reflected light reflected on the respective surfaces of a display panel and a protective plate without employing a complicated structure and without degrading display quality, even if the protective plate is disposed on the surface of the display panel.

After various studies on means for reducing reflected light reflected on the respective boundary surfaces of a display panel and protective plate without employing a complicated structure and without degrading display quality, even if the protective plate is disposed on the surface of the display panel, the present inventor paid attention to the configuration of the display panel and the protective plate. And it has been discovered that according to the conventional structure, an antireflection effect can be obtained by the structure of the circularly polarizing plate, but a new λ/4 plate must be fabricated and in particular the λ/4 plate must be attached such that the optical axis (stretch axis) is turned 45° from the polarization axis of the polarizer, this is however a branch type attachment of which production efficiency is poor, and it is actually difficult to fabricate a λ/4 plate which provides a phase difference of one fourth of the wavelength λ without error, or which has an optical axis in a desired direction by specifying the stretch axis direction without error.

The present inventor has also discovered that if a plurality of λ/4 plates are disposed, the phase difference cannot be accurately canceled because of an optical design error of each λ/4 plate or a shift of the stretch axis direction of each λ/4 plate, and that display quality is degraded such that the display is tinted or the display is darkened when viewing the display surface from a diagonal direction since the λ/4 plates are disposed such that the axes of the λ/4 plates have an angular gap therebetween, whereby the angle of the axes of the λ/4 plates is 90° when viewed from the front, but the apparent angle is less than 90° when viewed from the diagonal.

The inventor intensely has studied these problems and has discovered that the reflected light on the surface of the display panel and the protective plate can be reduced without disposing the λ/4 plate by disposing only a normal polarizer, not the circularly polarizing plate, on the protective plate, so that the light passing between the display panel and the protective plate is not circularly polarized light but linearly polarized light, whereby the above mentioned problems can be solved, and the present invention reached.

In other words, the present invention is a display device, comprising:

a display panel; and a protective plate disposed facing the display panel, wherein the protective plate comprises a protective base material and a first polarizer, the display panel comprises a second polarizer of which a polarization axis is parallel to that of the first polarizer, and light passing between the first polarizer and the second polarizer is linearly polarized light. The present invention will now be described.

The display device of the present invention is a display device comprising a display panel and a protective plate which is disposed facing the display panel, and the protective plate has a protective base material and a first polarizer. Examples of the display panel includes, but not limited to, a cathode ray tube (CRT) display panel, a liquid crystal display (LCD) panel, plasma display panel (PDP), and an electroluminescence (EL) display panel. An LCD panel having a polarizer or an EL display panel in which a circularly polarizing plate is disposed inside to prevent reflection in the display device is preferable, since the display panel of the present invention has a polarizer.

The display device of the present invention, which has a protective plate, is suitable for a game machine, portable telephone, instrument panel of a vehicle and notebook PC. Other structure may or may not be disposed between the display panel and the protective plate, but in terms of preventing warping of the protective plate due to heat, cushioning impact from the outside onto the display panel, and ease of rework, it is preferable that the display panel and protective plate are not directly contained, that is, an air layer (space) is disposed between the display panel and the protective plate. The protective plate is comprised of the protective base material and a polarizer disposed on the protective base material, and the protective base material mainly serves as the protective plate. The material of the protective base material is not especially limited, but it is preferable that this material has transparency and is rigid under normal temperatures.

The display panel has a second polarizer of which the polarization axis is parallel to that of the first polarizer, and the light passing between the first polarizer and the second polarizer is linearly polarized light. In the present invention, "linearly polarized light" is polarized light which substantially vibrates along one straight line when viewed from a direction facing the light traveling direction, and may be elliptically polarized light when viewed from a direction facing the light traveling direction, as long as it is substantially linear. "The second polarizer of which polarization axis is parallel to that of the first polarizer" may include some shift in the axis direction, as long as the polarization axis of the first polarizer and the polarization axis of the second polarizer are substantially parallel to each other when the first polarizer and the second polarizer are superposed. In concrete terms, it is preferable that the transmittance is 80% or more when the linearly polarized light passes through the first and second polarizers having an axis parallel to the axis of this linearly polarized light. In order to maintain the light passing between the first polarizer and second polarizer to be linearly polarized light, it is preferable that nothing to convert the light polarization state is disposed between the first polarizer and the second polarizer. In concrete terms, it is preferable that no phase difference structure, of which the phase difference viewed in the direction orthogonal to the display panel surface is in a 100 to 175 nm range, that is about ¼ the center wavelength of the visible light 550 nm, is placed between the first polarizer and second polarizer.

A principle of reducing light reflected on the surfaces of the protective plate and the display panel by the configuration of the present invention will now be described. When the protective plate is disposed facing the display panel, some components of incident light from the outside are reflected when the light passes through an interface of different refractive indexes, such as the surface of the protective plate, or the surface of the display panel. According to the present invention, a polarizer is disposed on the protective plate, whereby the incident light from the outside is reduced to about half while passing through the polarizer. The light reflected on the surface of the protective plate, the surface of the display panel or inside the display panel, progresses in reverse toward the outside, and passes through the polarizer again. The light reflected inside the display panel actually has some phase difference, and becomes elliptically polarized light close to the linearly polarized light, so some quantity of light is reduced again when passing through the polarizer the second time. As a result, components of the light entered from the outside and reflected on the surface of the protective plate and the surface of the display panel are drastically reduced.

According to the present invention, the polarization axes of the polarizer of the protective plate (first polarizer) and the polarizer of the display panel (second polarizer) are parallel, so almost no phase difference is generated in the light passing through these polarizers, and therefore the light that has passed through one polarizer can directly pass through the other polarizer. As a result, even if the polarizer is disposed between the protective plate and the display panel, a drop in transmittance of the light used for the display can be prevented.

Furthermore according to the configuration of the present invention, light reflected in the display panel can also be reduced. A part of the incident light, which was not reflected on the surface of the protective plate and the surface of the display panel, is reflected inside the display panel. This is because such conductive elements as electrodes and lines are disposed inside the display panel for driving the display device, and a metal film that exhibits a reflecting nature is normally used for these conductive elements. According to the configuration of the present invention, light reflected inside the display panel is also emitted after passing through the first and second polarizers, so some quantity of light is reduced while passing through these polarizers.

The configuration of the display device of the present invention is not particularly limited, and may or may not include other composing elements, as long as these essential composing elements are used. For example, an optical sheet, such as a retardation film, for further providing optical characteristics to the light passing through the polarizer, may be disposed not on the surfaces of the first and second polarizers facing each other, but on the opposite side surfaces. In the case of a non-self-light emitting display device, a separate light source, such as a back light, may be disposed.

Preferred configurations of the display device of the present invention will now be described in detail.

It is preferable that the first polarizer is disposed on the display panel side of the protective base material. Thereby scratches on the first polarizer or contamination of the first polarizer can be prevented, and the function as a polarizer can be maintained longer.

It is preferable that he protective plate further comprises a first antireflection layer on the display panel side surface of the protective plate. By forming the first antireflection layer on the surface of the protective plate facing the inside of the display device, components of light reflected upon emitting from the protective plate can be decreased. According to this configuration, the antireflection layer is disposed between the protective plate and the display panel, so the antireflection layer can also be protected by the protective plate.

It is preferable that the display panel further comprises a second antireflection layer on the protective plate side surface of the display panel. By forming the second antireflection layer on the surface of the display panel on the side of the protective plate, components of light reflected upon entering the display panel can be decreased. According to this configuration, the antireflection layer is disposed between the protective plate and the display panel, so the antireflection layer can also be protected by the protective plate.

It is preferable that the protective plate further comprises a third antireflection layer on the surface, facing the outside, of the protective plate. By forming the third antireflection layer on the surface of the protective plate facing the outside, components of reflected light upon entering the display device can be decreased.

By forming the antireflection film on the surface of the protective plate or display panel, the light reflected on the surface of the protective plate or the surface of the display panel can be reduced. In the case of disposing a protective plate on the display panel, like the case of the present invention, reflected light is easily generated on the surface of the protective plate or the display panel, so this configuration is particularly preferable for the present invention. The present invention does not obtain the antireflection effect by converting the light into circularly polarized light once and changing the direction of the polarization axis so as to block light, like the case of preventing reflection using a circularly polarizing plate, but obtains the antireflection effect by decreasing the absolute quality of light passing through the polarizer without changing the polarization axis, so by disposing the antireflection layer for decreasing the absolute quantity of reflected light, reflection can be additionally prevented, and the antireflection effect increases. These configurations of forming the first, second and third antireflection layers can be combined to generate a better effect, and a cumulative antireflection effect of each configuration can be obtained.

It is preferable that the display panel has a third polarizer, a first substrate, a liquid crystal layer, a second substrate, and the second polarizer, in this order toward the protective plate. In other words, it is preferable that the display panel is a liquid crystal display panel, and the display device of the present invention is a liquid crystal display device. A liquid crystal display device normally has a pair of polarizers between which a liquid crystal layer is disposed, so by using one of the polarizers as the second polarizer of the present invention, only the reflected light can be effectively reduced without reducing significantly the transmitted light for a normal liquid crystal display device. For the liquid crystal display panel, many electrodes and lines are normally disposed in the first and/or second substrate in order to apply voltage to the liquid crystal layer, but many of these electrodes and lines are constituted by a light-reflective material. In the present invention however, the antireflection effect can be obtained even for the light reflected in the liquid crystal display panel, so a liquid crystal display device excellent in antireflection characteristics can be implemented.

It is preferable that the display panel has a first electrode, an organic electroluminescence layer, a second electrode, a ¼ plate, and the second polarizer, in this order toward the protective plate. In other words, it is preferable that the display panel is an organic electro-luminescence panel having a circularly polarizing plate, and the display device of the present invention is an organic electro-luminescence display device having a circularly polarizing plate. The organic EL display device is a display device using light self-emitted from the organic EL layer, and has two display types: a bottom emission type, and a top emission type. A translucent electrode is normally disposed on one surface of the organic EL layer, and an opaque (reflective) electrode is disposed on the other surface, and the display light is emitted from one side of the surfaces of the organic EL layer. Then the light entered from the outside is at least reflected by the opaque (reflective) electrode, and many reflected components exist. Therefore in the organic EL display device, it is preferable that a stack structure (a circularly polarizing plate) of a λ/4 plate and a polarizer is disposed on the display surface side of the second electrode, so as to reduce the reflected light. The antireflection principle using the circularly polarizing plate is the same as the above-mentioned antireflection principle of the liquid crystal display device using the circularly polarizing plate. By using the polarizer disposed like this for one of the polarizers of the present invention, the quantity of light reflected on the surface of the protective plate and the surface of the display panel can be reduced even if the organic EL panel has a protective plate.

According to the display device of the present invention, even if a protective plate is disposed on the display panel, light reflected on the surfaces of the display panel and the protective plate, and the light reflected inside the display panel can be reduced without employing a complicated structure, and without degrading display quality.

BEST MODE FOR CARRYING OUT THE INVENTION

Embodiments of the present invention will now be described in detail with reference to the drawings, but the present invention is not limited to these embodiments.

Embodiment 1

Figure 1:
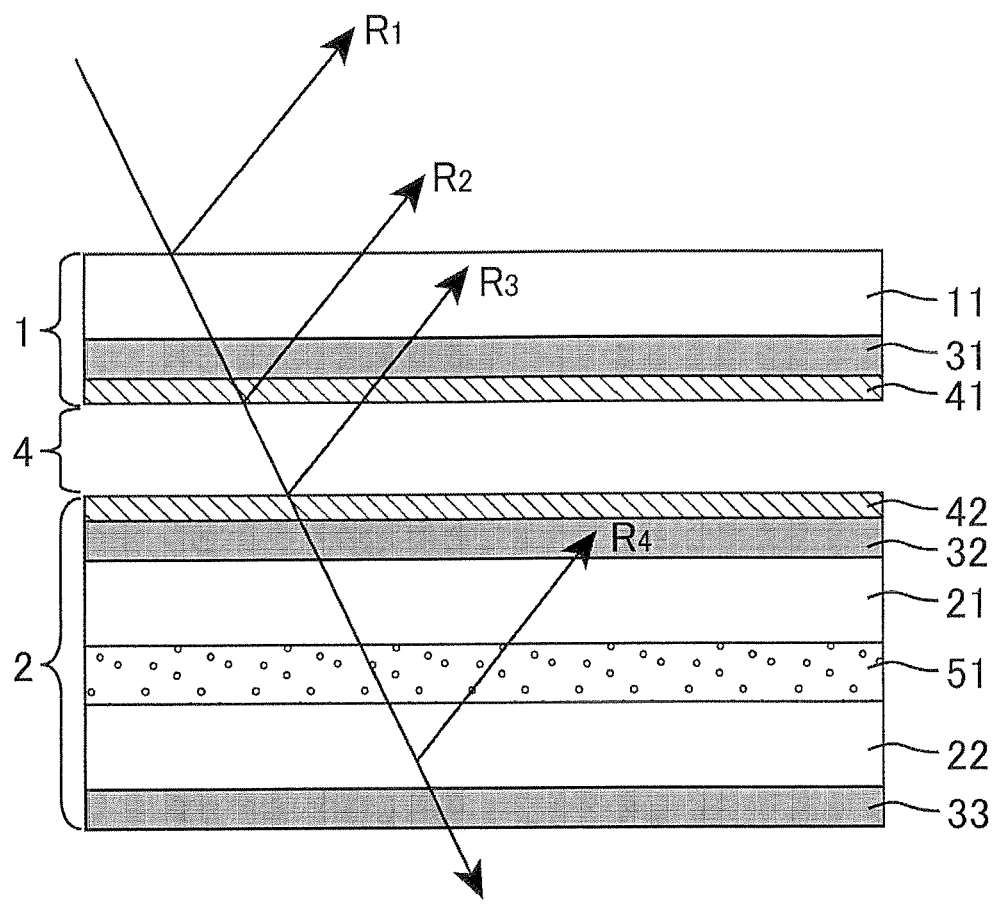
FIG. 1 is a cross-sectional view schematically depicting a configuration of a display device of Embodiment 1.

FIG. 1 is a cross-sectional view schematically depicting a configuration of a display device of Embodiment 1. The display device of Embodiment 1 has a display panel 2 and a protective plate 1 disposed facing the display panel 2, and the display panel 2 and the protective plate 1 are disposed in this order toward the display surface side (observation surface side). By disposing the protective plate 1 on the display surface side of the display panel 2, scratches and contamination of the display panel 2 can be prevented, and the display panel 2 can be protected from impact from the outside. The protective plate 1 includes a protective base material 11 and a first polarizer 31, and the protective base material 11 mainly serves as the protective plate 1. The material of the protective base material 11 is not particularly limited, but is preferably transparent and is rigid under normal temperatures. Examples of such a material include glass and curable resin having transparency. The protective plate 1 may have a flat surface or curved surface, and the shape of the protective plate 1 is not particularly limited, and can be appropriately chosen according to the design. It is preferable that the protective plate 1 covers, in particular, the entire area (display area), of the display panel 2, constituting the display screen. The first polarizer 31 of the protective plate 1 is disposed preferably on the display panel 2 side of the protective base material 11 for resistance, but may be disposed closer to the outside than the protective base material 11. In other words, according to the present embodiment, the protective plate may have a configuration where the protective base material and the first polarizer are disposed in this order toward the display surface side (observation surface side).

The first polarizer 31 includes a polarizing element which can convert natural light emitted from a light source into polarized light vibrating in a predetermined direction (polarization axis direction). For the polarizing element, a polyvinyl alcohol (PVA) film, on which an iodine complex or dichroism pigment is absorbed, can be used, and is fabricated by stretching the film in one direction. The PVA film, however, can be very easily deformed or shrunk, especially under humidified conditions, and the mechanical strength of the film itself is weak, since a hydrophilic polymer is used, therefore such a base material as a TAC (Tri Acetyl Cellulose) film, which functions as a protective film to protect the polarizing element, is attached to one or both side(s) of the polarizing element. The TAC film has a low depolarization characteristic (characteristic to disturb polarization), and excels in translucency and durability, therefore it is an excellent protective film for protecting a polarizing element. In this way, the first polarizer 31 is comprised of a polarizing element and a pair of protective films between which the polarizing element is disposed, whereby the strength of the polarizer can be compensated, and reliability of the polarizing element can be secured.

In Embodiment 1, the liquid crystal display (LCD) panel is used for the display panel 2. In concrete terms, the display panel 2 has a rear face side polarizer (third polarizer) 33, a second substrate 22, a liquid crystal layer 51, a first substrate 21 and an observation surface side polarizer (second polarizer) 32 in this order toward the protective plate 1.

The display panel 2 has polarizers disposed on the rear face side of the second substrate 22 and on the observation surface side of the first substrate 21, respectively. For the observation surface side polarizer (second polarizer) 32 disposed on the observation surface side of the first substrate 21 and the rear face side polarizer (third polarizer) 33 disposed on the rear face side of the second substrate 22, the same material and configuration as the first polarizer 31 can be used. The polarization axis of the observation surface side polarizer 32 and the polarization axis of the rear face side polarizer 33 may be parallel or intersect orthogonally, which can be appropriately selected depending on the alignment mode of liquid crystals or whether display is a white display (normally white mode) or a black display (normally black mode) when voltage is not applied to the liquid crystal layer 51.

The axis direction of the polarization axis of the polarizer (first polarizer) 31 of the protective plate 1 and the axis direction of the polarization axis of the polarizer of the observation surface side (second polarizer) 32 of the display panel 2 must be matched, and these polarization axes are parallel to each other. In Embodiment 1, a layer which disturbs the phase difference of the transmitted light, such as a liquid crystal layer and a λ/4 plate, is not formed between the first polarizer 31 and the second polarizer 32, therefore the light that passes between the first polarizer 31 and the second polarizer 32 can be linearly polarized light, and light that has passed through the second polarizer 32 can directly pass through the first polarizer 31, and as a result, light for the display can be caused to pass through without dropping transmittance significantly.

A first antireflection layer 41 is formed on the display panel 2 side surface of the protective plate 1, and a second antireflection layer 42 is formed on the protective plate 1 side surface of the display panel 2. Thereby the reflection of light on the surfaces of the protective plate 1 and the display panel 2 can be prevented. Examples of the antireflection layers 41 and 42 include: an LR (Low Reflection) film, which cancels light reflected on the surface of the protective base material 11 and the light reflected on the surface of the antireflection layer 41 or 42 by mutual interference; and a moth-eye film, which has a bump pattern having a plurality of convex portions of which the width between adjacent vertexes is the visible light wavelength (380 nm) or less on the surface of the antireflection layer 41 or 42, and makes the change of refraction index in the boundary of the outside (air) and the surface of the protective plate 1 to be artificially continuous, so that it can transmit almost all light regardless of the interface of the refractive indexes. According to the LR film, 1 to 3% of low reflectance can be obtained, and according to the moth-eye film, 0.5% or less of low reflectance can be obtained. It is possible to dispose an antireflection layer on the surface of the protective plate 1 facing the outside (Embodiment 4), but the antireflection layer is normally insufficient in strength, so the antireflection layer is disposed between the protective plate 1 and the display panel 2, so as to continuously obtain the antireflection effect while being protected by the protective layer 1.

The protective plate 1 and the display panel 2 are not in direct contact, but a predetermined space (air layer) 4 is created between the protective plate 1 and the display panel 2. By creating this predetermined space, the basic design is not affected very much, even if the protective plate is warped by heat, and direct impact on the display panel 2 can be mitigated even if the protective plate 1 receives impact from the outside. Furthermore, rework becomes easier when rework is required. However, creating a predetermined space like this generates an interface of different refractive indexes between the protective plate 1 and the air layer 4, and between the display panel 2 and the air layer 4, and reflection tends to be generated on this interface. But according to the configuration of the present invention, degradation of display quality is suppressed even if this predetermined space is created, since means for reducing the quantity of reflected light generated on the interface of different refractive indexes is provided. The distance between the protective plate 1 and the display panel 2 (width of the air layer 4) is actually 3 to 5 mm.

Now a case of using the second substrate 22 as the active matrix substrate and the first substrate 21 as the color filter substrate will be described. The active matrix substrate (second substrate) 22 is a support substrate made of glass, for example, and various lines and electrodes are formed on this support substrate. On the support substrate, a plurality of gate signal lines and auxiliary capacitance (Cs) lines which extend in parallel to each other, a plurality of source signal lines which intersect with the gate signal lines and auxiliary capacitance lines and extend in parallel to each other, and thin film transistors (TFT) formed at each intersection of the gate signal line and the source signal line, are disposed. The TFT is a three-terminal field-effect transistor, and has three electrodes: gate electrode, source electrode, and drain electrode, in addition to a semiconductor layer. The TFT becomes a switching element for controlling the driving of pixels, which will be described later.

As the material of these various lines and electrodes of TFT, a material having low resistance and a high melting point, such as aluminum (Al), silver (Ag), tantalum nitride (TaN), titanium nitride (TiN), and molybdenum nitride (MoN), is preferably used in terms of conductivity and reliability. The active matrix substrate also has a plurality of pixel electrodes on an insulation film which is formed on these various lines and TFTs. Each pixel electrode constitutes a small pixel, and pixel electrodes are disposed in a matrix with a predetermined space therebetween. The pixel electrode is connected with a drain electrode of a TFT via a contact hole disposed in the insulation film, and a part of the various lines are connected with the pixel electrode via the source electrode, semiconductor layer and drain electrode of the TFT. Thereby the driving of ON/OFF of the pixel is controlled using the switching function of the TFT. It is preferable that the pixel electrode is translucent, and such metal oxide films as ITO (Indium Tin Oxide) or IZO (Indium Zinc Oxide) can be used.

The color filter substrate (second substrate) 21 is a substrate having a support substrate made of glass, for example, and a common electrode, color filter, black matrix and the like on the support substrate. The common electrode is disposed so as to interpose the liquid crystal layer with the pixel electrode, whereby a predetermined voltage can be applied to the liquid crystal layer, and is formed on the entire surface of the support substrate. The same material(s) of the pixel electrode can be used for the material(s) of the common electrode. The color filter is constituted by a sub-pixel having three primary colors: red, green and blue, for example, and is designed such that one color filter corresponds to one sub-pixel. Thereby color display can be controlled for each pixel, and good color display can be implemented. The black matrix is formed by a black resin, for example, and is disposed between color filters so as to prevent light leakage.

The liquid crystal layer 51 is filled with liquid crystal material having a characteristic of aligning in a specific direction by a predetermined voltage being applied. Alignment of the liquid crystal molecules in the liquid crystal layer 51 is controlled by applying a predetermined or higher voltage, and the control mode thereof is not especially limited, and can be a TN (Twisted Nematic) mode, a VA (Vertical Alignment) mode and an IPS (In-Plane Switching) mode, for example.

The path of light when incident light into the liquid crystal display device of Embodiment 1 is reflected and the reflectance at each reflection point will be described with reference to FIG. 1.

A part of the components of the incident light from the outside are reflected on the surface of the protective plate 1 facing the outside, and emitted to the outside as reflected light R1. If the protective base material 11 is made of glass, the reflectance here is about 4.0%. Therefore if the intensity of the incident light is 100%, then the intensity of the reflected light R1, which is emitted to the outside, is 4.0%.

Light other than the light reflected as the reflected light R1 travels inside the display device, and passes through the first polarizer 31. Since the first polarizer 31 allows transmitting only the components having a specific vibration direction with respect to the natural light, light other than the light reflected as reflected light R1 is blocked upon passing through the first polarizer 31, except for the linearly polarized light having the same vibration direction as the polarization axis of the first polarizer 31. In concrete terms, out of the remaining 96% of light after the reflected light R1 is removed, 96×0.42=40% travels inside the display device, since the transmittance of the first polarizer 31 is about 42%.

Concerning the light which reached the display panel 2 side surface of the protective plate 1, some components are reflected by the display panel 2 side surface of the protective plate 1, and are emitted to the outside as the reflected light R2. The reflectance here is about 1.4% if the first antireflection layer 41 is an LR film. Since the reflectance here is 1.4% with respect to the remaining light 40%, the intensity of the reflected light R2 on the display panel 2 side surface of the protective plate 1 is 40×0.014=0.56%. Subsequently, with regard to the traveling of the reflected light R2, the reflected light R2 passes through the first polarizer 31 again. In this case, the polarization axis of the reflected light R2 is not so different from that of the reflected light R2 after passing through the first polarizer 31, so in theory this light is not blocked by the first polarizer 31, but actually when light entered diagonally to the display surface is reflected, some phase difference may be generated, and elliptically polarized light may be formed. In this case, the transmittance of the light passing through the first polarizer 31 is about 86%, so the intensity of the reflected light R2, which is actually emitted to the outside, is 0.56×0.86=0.48%.

Concerning the light which reached the protective plate 1 side surface of the display panel 2, some components are reflected on the surface of the display panel 2 on the protective plate 1 side, and are emitted to the outside as reflected light R3. The reflectance here is about 1.4% if the second antireflection layer 42 is an LR film. Since the reflectance here is 1.4% with respect to the remaining light 40−0.56=39%, the intensity of the reflected light R3 on the protective plate 1 side surface of the display panel 2 is 39×0.014=0.55%. Subsequently, with regard to the traveling of the reflected light R3, the reflected light R3 passes through the first polarizer 31 again. In this case as well, the polarization axis of the reflected light R3 is not so different from the polarization axis after passing through the first polarizer 31, so in theory this light is not blocked by the first polarizer 31, but actually the transmittance of the light passing through the first polarizer 31 at this time is about 86%, therefore the intensity of the reflected light R3, which is actually emitted to the outside, is 0.55× 0.86=0.47%.

Light other than the light reflected as reflected light R3 travels inside the display device, and passes through the second polarizer 32. The polarization axis of the first polarizer 31 and the polarization axis of the second polarizer 32 are parallel to each other, and the polarization axis of light other than the light reflected as reflected light R3 is not so different from the polarization axis after passing through the first polarizer 31, so in theory this light is not blocked by the second polarizer 32, but actually the transmittance of the light passing through the second polarizer 32 at this time is about 86%, so out of the remaining 39.5−0.55=39.0% of light after the reflected light R3 is removed, 39.0×0.86=33.5% travels inside the display device.

Some components of the light traveling inside the display panel 2 are reflected by the surfaces of a metal film of aluminum (Al), silver (Ag), tantalum nitride (TaN), titanium nitride (TiN) or molybdenum nitride (MoN) constituting the gate signal line, data signal line and CS line, the gate electrode, source electrode and drain electrode of the TFT, which are formed inside the display panel 2, or a metal oxide film, such as ITO and IZO, constituting the pixel electrode and common electrode, and are emitted to the outside as reflected light R4. The reflectance or transmittance of light traveling inside the display panel 2, however, cannot be generalized, since there is such an element as a liquid crystal layer 51 which generates a phase difference for the transmitted light, and it depends on cases, such as which one of the above mentioned metal films and metal oxide films will reflect light. But in any case, the reflected light R4 passes through the second polarizer 32 and the first polarizer 31, and the transmittance of the reflected light R4 passing through the first polarizer 31 after passing through the second polarizer 32 is about 86%, so the reflected light components are reduced accordingly.

In Embodiment 1, the total quantity of light (R1+R2+R3) emitted to the outside after reflected on the surfaces of the protective plate 1 and the display panel 2 is 4.0%+0.48%+ 0.47%=5.0%, when the intensity of incident light is 100%.

Embodiment 2

Figure 2:
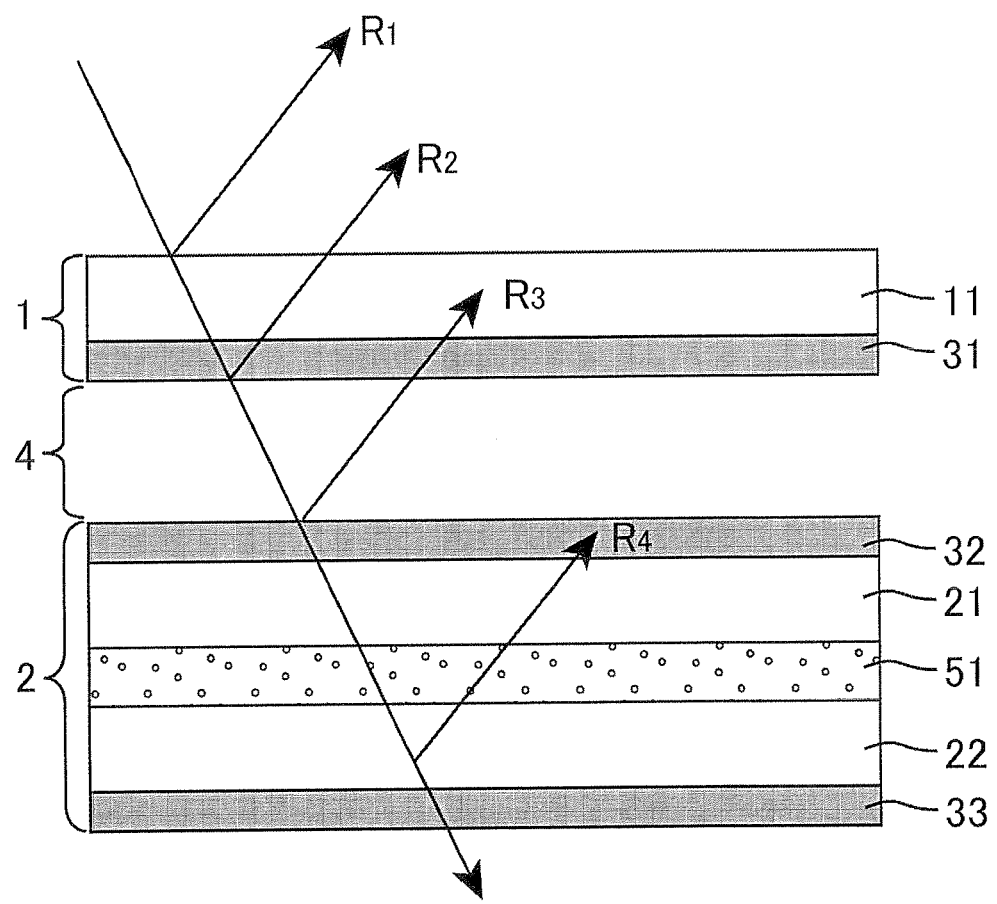
FIG. 2 is a cross-sectional view schematically depicting a configuration of a display device of Embodiment 2.

FIG. 2 is a cross-sectional view schematically depicting a configuration of a display device of Embodiment 2. The display device of Embodiment 2 is the same as the display device of Embodiment 1, except that the antireflection layer is not disposed on the display panel side surface of the protective plate or on the protective plate side surface of the display panel.

The path of light when the incident light into the liquid crystal display device of Embodiment 2 is reflected, and reflectance at each reflection point will be described with reference to FIG. 2.

A part of the components of the light entered from the outside is reflected on the surface of the protective plate 1 facing the outside, and emitted to the outside as reflected light R1. If the protective base material 11 is made of glass, the reflectance here is about 4.0%. Therefore if the intensity of the incident light is 100%, the intensity of the reflected light R1, which is emitted to the outside, is 4.0%.

Light other than the light reflected as reflected light R1 travels inside the display device, and passes through the first polarizer 31. Since the first polarizer 31 allows transmitting only the components having a specific vibration direction with respect to the natural light, the light other than the light reflected as reflected light R1, except for the linearly polarized light having a same vibration direction as the polarization axis of the first polarizer 31, is blocked upon passing through the first polarizer 31. In concrete terms, out of the remaining 96% of light after reflected light R1 is removed, 96×0.42=40% travels inside the display device since the transmittance of the first polarizer 31 is about 42%.

Concerning the light which reached the display panel 2 side surface of the protective plate 1, some components are reflected by the display panel 2 side surface of the protective plate 1, and are emitted to the outside as reflected light R2. The reflectance on the surface of the protective plate 1 is about 4%. Since the reflectance here is 4% with respect to the remaining light 40%, the intensity of the reflected light R2 on the surface of the protective plate 1 on the display panel 2 side is 40×0.04=1.6%. Subsequently, with regard to the traveling of the reflected light R2, the reflected light R2 passes through the first polarizer 31 again. In this case, the polarization axis of the reflected light R2 is not so different from the polarization axis after passing through the first polarizer 31, so in theory this light is not blocked by the first polarizer 31, but when light entered diagonally to the display surface is reflected, some phase difference may be generated, and elliptically polarized light may be formed. In this case, the transmittance of the light passing through the first polarizer 31 is about 86%, therefore the intensity of the reflected light R2, which is actually emitted to the outside, is 1.6×0.86=1.4%.

Concerning the light which reached the protective plate 1 side surface of the display panel 2, some components are reflected on the protective plate 1 side surface of the display panel 2, and are emitted to the outside as reflected light R3. The reflectance on the surface on the protective plate 1 side is about 4%. Since the reflectance here is 4.0% with respect to the remaining light 40−1.6=38%, the intensity of the reflected light R2 on the display panel 2 side surface of the protective plate 1 is 38.4×0.04=1.5%. Subsequently, with regard to the traveling of the reflected light R3, the reflected light R3 passes through the first polarizer 31 again. In this case as well, the polarization axis of the reflected light R3 is not so different from the polarization axis after passing through the first polarizer 31, so in theory this light is not blocked by the first polarizer 31, but actually the transmittance of the light passing through the first polarizer 31 at this time is about 86%, therefore the intensity of the reflected light R3, which is actually emitted to the outside, is 1.5×0.86=1.3%.

Light other than the light reflected as the reflected light R3 travels inside the display device, and passes through the second polarizer 32, but the description on the reflected light R4, which is the same as Embodiment 1, is omitted.

In Embodiment 2, the total quantity of light (R1+R2+R3) emitted to the outside after reflected on the surfaces of the protective plate 1 and the display panel 2 is 4.0%+1.4%+1.3%=6.7%, when the intensity of incident light is 100%.

Embodiment 3

Figure 3:
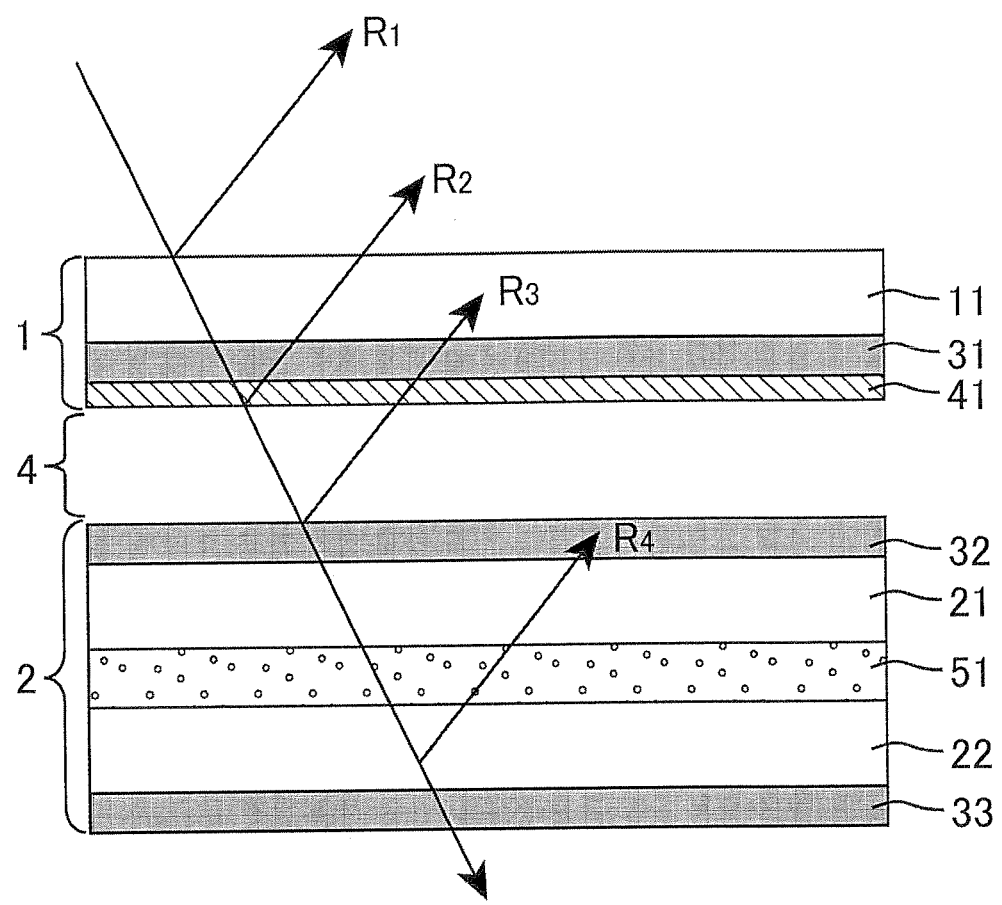
FIG. 3 is a cross-sectional view schematically depicting a configuration of a display device of Embodiment 3.

FIG. 3 is a cross-sectional view schematically depicting a configuration of a display device of Embodiment 3. The display device of Embodiment 3 is the same as the display device of Embodiment 1, except that the antireflection layer is disposed only on one of the surface of the protective plate and the surface of the display panel. In FIG. 3, a first antireflection layer 41 is on the display panel 2 side surface of the protective plate 1, but a same effect can be obtained even in a configuration where a second antireflection layer is on the protective plate 1 side surface of the display panel 2, and this configuration is also included in the present embodiment.

The path of light when the light entered the liquid crystal display device of Embodiment 3 is reflected, and reflectance at each reflection point will be described with reference to FIG. 3.

A part of the components of the light entered from the outside are reflected on the surface of the protective plate 1 facing the outside, and are emitted to the outside as reflected light R1. If the protective base material 11 is made of glass, the reflectance here is about 4.0%. Therefore if the intensity of the incident light is 100%, the intensity of the reflected light R1, which is emitted to the outside, is 4.0%.

Light other than the light reflected as the reflected light R1 travels inside the display device, and passes through the first polarizer 31. Since the first polarizer 31 allows transmitting only the components having a specific vibration direction with respect to the natural light, the light other than light reflected as reflected light R1 is blocked upon passing through the first polarizer 31, except for the linearly polarized light having a same vibration direction as the polarization axis of the first polarizer 31. In concrete terms, out of the remaining 96% of light after the reflected light R1 is removed, 96×0.42=40% travels inside the display device, since the transmittance of the first polarizer is about 42%.

Concerning the light which reached the display panel 2 side surface of the protective plate 1, some components are reflected by the display panel 2 side surface of the protective plate 1, and are emitted to the outside as reflected light R2. Reflectance here is about 1.4% if the first antireflection layer 41 is an LR film. Since the reflectance here is 1.4% with respect to the remaining light 40%, the intensity of the reflected light R2 on the display panel 2 side surface of the protective plate 1 is 40×0.014=0.56%. Subsequently, with regard to the traveling of the reflected light R2, the reflected light R2 passes through the first polarizer 31 again. In this case, the polarization axis of the reflected light R2 is not so different from the polarization axis after passing through the first polarizer 31, so in theory this light is not blocked by the first polarizer 31, but when light entered diagonally to the display surface is reflected, some phase difference may be generated, elliptically polarized light may be formed. In this case, the transmittance of the light passing through the first polarizer 31 is about 86%, therefore the intensity of the reflected light R2, which is actually emitted to the outside, is 0.56×0.86=0.48%.

Concerning the light which reached the protective plate 1 side surface of the display panel 2, some components are reflected on the protective plate 1 side surface of the display panel 2, and are emitted to the outside as reflected light R3. The reflectance on the surface on the protective plate 1 side is about 4.0%. Since the reflectance here is 4.0% with respect to the remaining light 40−0.56≅39%, the intensity of the reflected light R2 on the display panel 2 side surface of the protective plate 1 is 39×0.04=1.6%. Subsequently, with regard to the traveling of the reflected light R3, the reflected light R3 passes through the first polarizer 31 again. In this case as well, the polarization axis of the reflected light R3 is not so different from the polarization axis after passing through the first polarizer 31, so in theory this light is not blocked by the first polarizer 31, but actually the transmittance of the light passing through the first polarizer 31 at this time is about 86%, therefore the intensity of the reflected light R3, which is actually emitted to the outside, is 1.6×0.86=1.4%.

Light other than the light reflected as reflected light R3 travels inside the display device, and passes through the second polarizer 32, but the description on the reflected light R4, which is the same as Embodiment 1, is omitted.

In Embodiment 3, the total quantity of light (R1+R2+R3) emitted to the outside after reflected on the surfaces of the protective plate 1 and the display panel 2 is 4.0%+0.48%+1.4%=5.9%, when the intensity of incident light is 100%.

Embodiment 4

Figure 4:
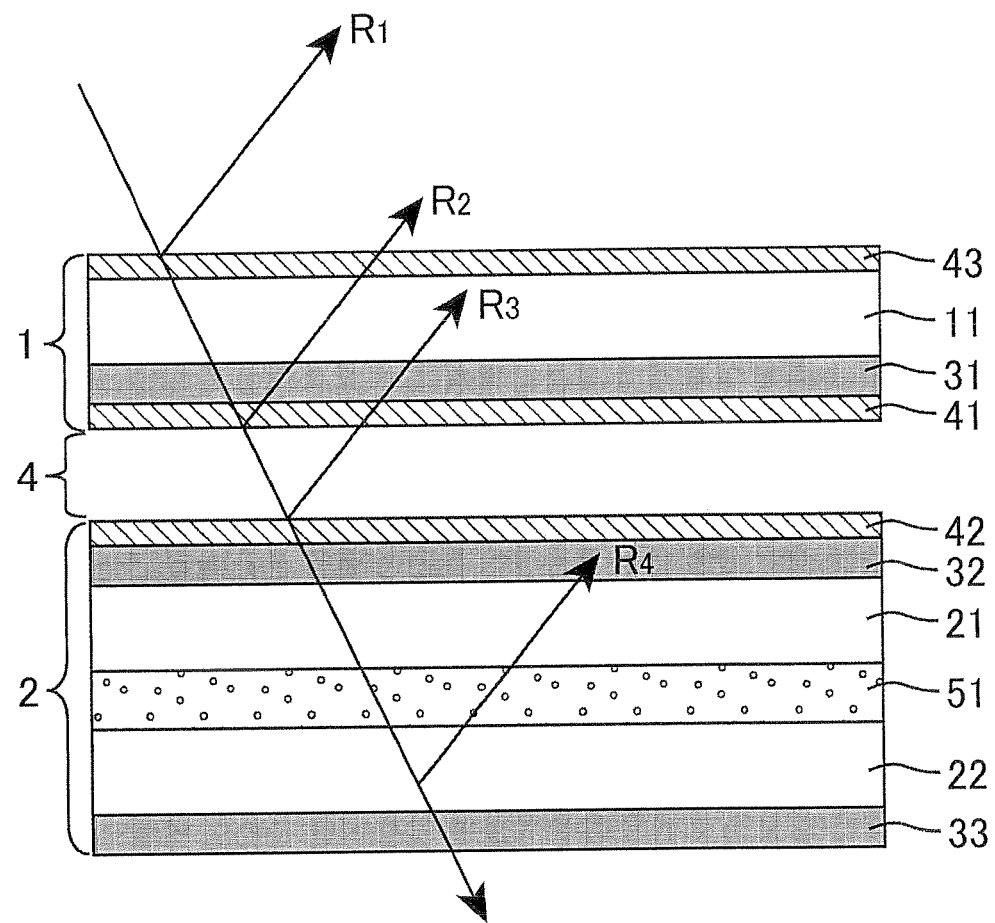
FIG. 4 is a cross-sectional view schematically depicting a configuration of a display device of Embodiment 4.

FIG. 4 is a cross-sectional view schematically depicting a configuration of a display device of Embodiment 4. The display device of Embodiment 4 is the same as the display device of Embodiment 1, except that a third antireflection layer 43 is disposed on the surface of the protective plate 1 facing the outside.

The path of light when the light entered the liquid crystal display device of Embodiment 4 is reflected, and reflectance at each reflection point will be described with reference to FIG. 4.

A part of the components of the light entered from the outside are reflected on the surface of the protective plate 1 facing the outside, and are emitted to the outside as reflected light R1. If the third antireflection layer 43 is an LR film, the reflectance here is about 1.4%. Therefore if the intensity of the incident light is 100%, then the intensity of the reflected light R1, which is emitted to the outside, is 1.4%.

Light other than the light reflected as the reflected light R1 travels inside the display device, and passes through the first polarizer 31. Since the first polarizer 31 allows transmitting only the component having a specific vibration direction with respect to the natural light, the light other than the light reflected as the reflected light R1 is reduced, upon passing through the first polarizer 31, only to the linearly polarized light having a same vibration direction as the polarization axis of the first polarizer 31. In concrete terms, out of the remaining 99% of the light after the reflected light R1 is removed, 99×0.42=42% travels inside the display device, since the transmittance of the first polarizer is about 42%.

Concerning the light which reached the display panel 2 side surface of the protective plate 1, some components are reflected on the display panel 2 side surface of the protective plate 1, and are emitted to the outside as the reflected light R2. The reflectance here is about 1.4% if the first antireflection layer 41 is an LR film. Since the reflectance here is 1.4% with respect to the remaining light 42%, the intensity of the reflected light R2 on the display panel 2 side surface of the protective plate 1 is 42×0.014=0.59%. Subsequently, with regard to the traveling of the reflected light R2, the reflected light R2 passes through the first polarizer 31 again. In this case, the polarization axis of the reflected light R2 is not so different from the polarization axis after passing through the first polarizer 31, so in theory this light is not blocked by the first polarizer 31, but when light entered diagonally to the display surface is reflected, some phase difference may be generated and elliptically polarized light may be formed. In this case, the transmittance of the light passing through the first polarizer 31 is about 86%, therefore the intensity of the reflected light R2, which is actually emitted to the outside, is 0.59×0.86=0.50%.

Concerning the light which reached the protective plate 1 side surface of the display panel 2, some components are reflected on the protective plate 1 side surface of the display panel 2, and are emitted to the outside as reflected light R3. The reflectance here is about 1.4% if the second antireflection layer 42 is an LR film. Since the reflectance here is 1.4% with respect to the remaining light 42−0.58=41%, the intensity of the reflected light R2 on the display panel 2 side surface of the protective plate 1 is 41×0.014=0.56%. Subsequently, with regard to the traveling of the reflected light R3, the reflected light R3 passes through the first polarizer 31 again. In this case as well, the polarization axis of the reflected light R3 is not so different from the polarization axis after passing through the first polarizer 31, so in theory this light is not blocked by the first polarizer 31, but actually the transmittance of the light passing through the first polarizer 31 at this time is about 86%, therefore the intensity of the reflected light R3, which is actually emitted to the outside, is 0.56×0.86=0.48%.

Light other than the light reflected as reflected light R3 travels inside the display device, and passes through the second polarizer 32, but the description on the reflected light R4, which is the same as Embodiment 1, is omitted.

In Embodiment 4, the total quantity of light (R1+R2+R3) emitted to the outside after reflected on the surfaces of the protective plate 1 and the display panel 2 is 1.4%+0.50%+0.48%=2.4%, when the intensity of incident light is 100%.

Reference Example 1

Figure 5:
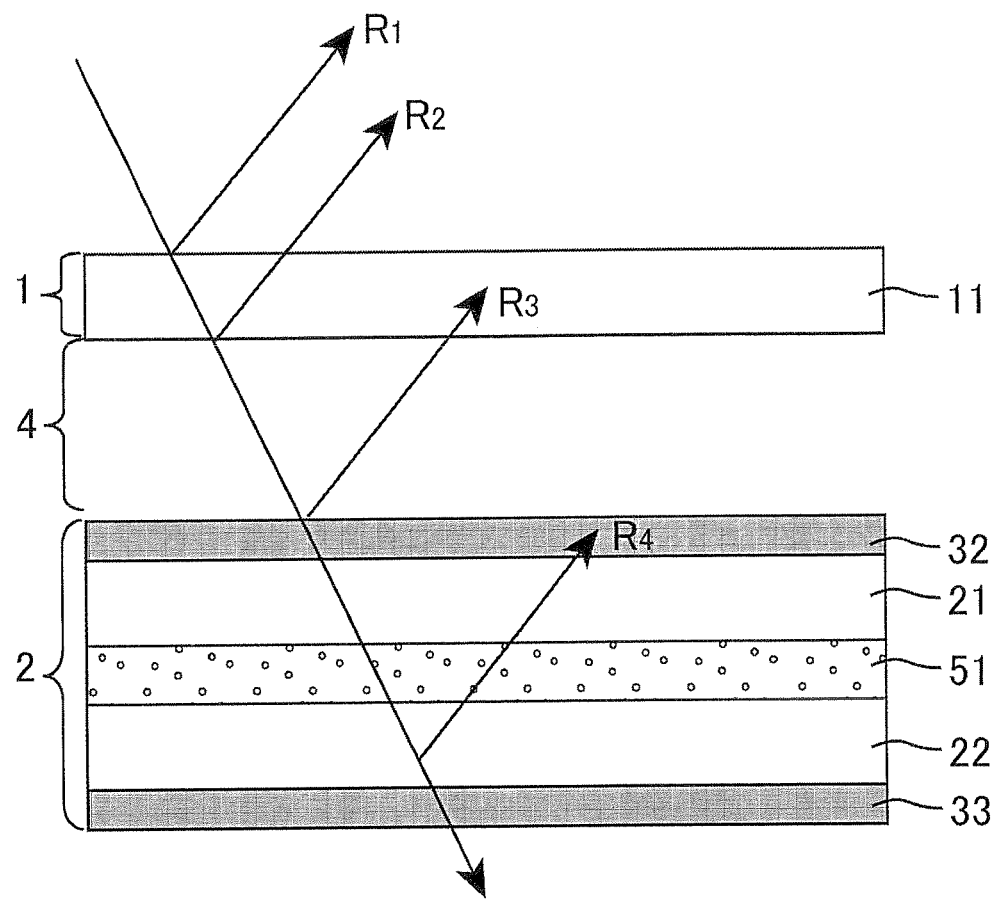
FIG. 5 is a cross-sectional view schematically depicting a configuration of a display device of Reference Example 1.

FIG. 5 is a cross-sectional view schematically depicting a configuration of a display device of Reference Example 1. The display device of Reference Example 1 is the same as the display device of Embodiment 1, except that the first polarizer for antireflection is not disposed, and the antireflection layer is not disposed on the surface of the protective plate or the surface of the display panel.

The path of light when the light entered the liquid crystal display device of Reference Example 1 is reflected, and reflectance at each reflection point will be described with reference to FIG. 5.

A part of the components of the light entered from the outside are reflected on the surface of the protective plate 1 facing the outside, and are emitted to the outside as reflected light R1. If the protective base material 11 is made of glass, the reflectance here is about 4.0%. Therefore if the intensity of the incident light is 100%, then the intensity of the reflected light R1, which is emitted to the outside, is 4.0%.

Light other than the light reflected as reflected light R1 reaches the display panel 2 side surface of the protective plate 1, then some components thereof are reflected on the display panel 2 side surface of the protective plate 1, and are emitted to the outside as reflected light R2. The reflectance on the display panel 2 side surface of the protective plate 1 is about 4.0%. Since the reflectance here is 4.0% with respect to the remaining light 96% after the reflected light R1 is removed, the intensity of the reflected light R2 on the display panel 2 side surface of the protective plate 1 is 96×0.04=3.8%, and this light is directly emitted to the outside.

Light other than the light reflected as reflected light R2 reaches the protective plate 1 side surface of the display panel 2, then some components thereof are reflected on the protective plate 1 side surface of the display panel 2, and are emitted to the outside as reflected light R3. The reflectance on the protective plate 1 side surface of the display panel 2 is about 4.0%. Since the reflectance here is 4.0% with respect to the remaining light 96−3.8=92%, the intensity of the reflected light R2 on the display panel 2 side surface of the protective plate 1 is 92×0.04=3.7%, and this light is directly emitted to the outside.

Light other than the light reflected as reflected light R3 travels inside the display device, and passes through the second polarizer 32, but unlike Embodiment 1, a further antireflection effect for the reflected light R4 is not obtained, since the first polarizer does not exist.

In Reference Example 1, the total quantity of light (R1+R2+R3) emitted to the outside after reflected on the surfaces of the protective plate 1 and the display panel 2 is 4.0%+3.8%+3.7%=12%, when the intensity of incident light is 100%.

Reference Example 2

Figure 6:
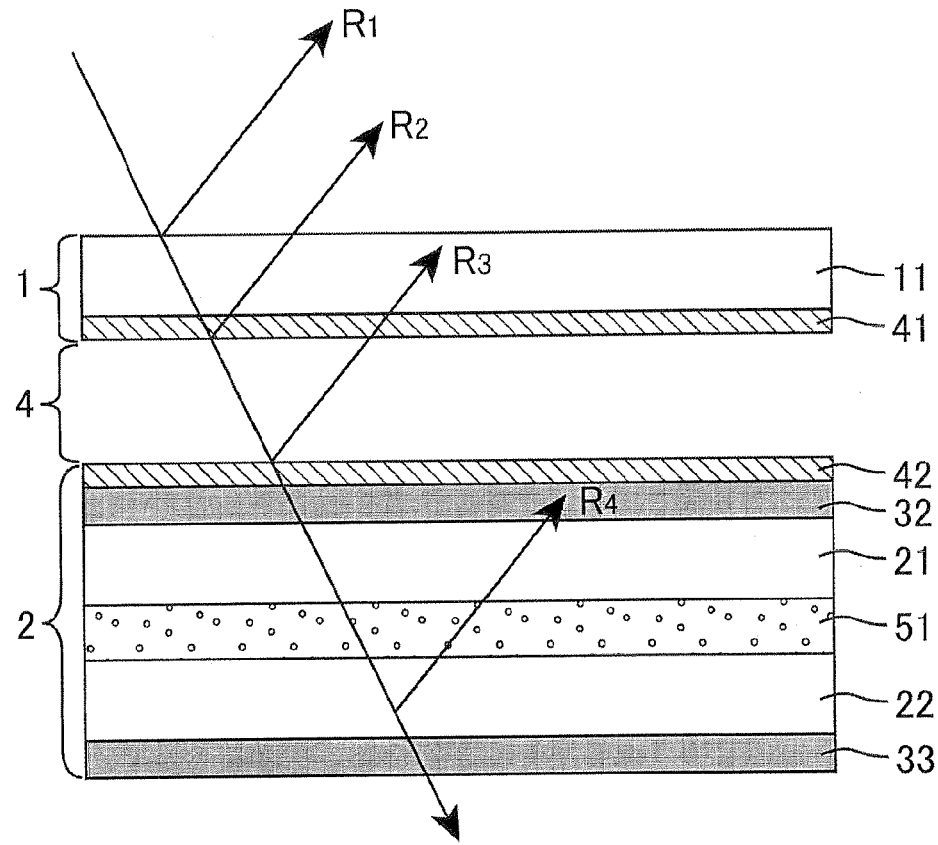
FIG. 6 is a cross-sectional view schematically depicting a configuration of a display device of Reference Example 2.

FIG. 6 is a cross-sectional view schematically depicting a configuration of a display device of Reference Example 2. The display device of Reference Example 2 is the same as the display device of Embodiment 1, except that the first polarizer for antireflection is not disposed.

The path of light when the light entered to the crystal display device of Reference Example 1 is reflected, and the reflectance at each reflection point will be described with reference to FIG. 6.

A part of the components of the light entered from the outside are reflected on the surface of the protective plate 1 facing the outside, and are emitted to the outside as reflected light R1. If the protective base material 11 is made of glass, the reflectance here is about 4.0%. Therefore if the intensity of the incident light is 100%, then the intensity of the reflected light R1, which is emitted to the outside, is 4.0%.

Light other than the light reflected as reflected light R1 reaches the display panel 2 side surface of the protective plate 1, then some components thereof are reflected on the display panel 2 side surface of the protective plate 1, and are emitted to the outside as reflected light R2. The reflectance is about 1.4% if the first antireflection layer 41 is an LR film. Since the reflectance here is 1.4% with respect to the remaining light 96% after the reflected light R1 is removed, the intensity of the reflected light R2 on the display panel 2 side surface of the protective plate 1 is 96×0.014=1.3%, and this light is directly emitted to the outside.

Light other than the light reflected as reflected light R2 reaches the protective plate 1 side surface of the display panel 2, then some components thereof are reflected on the protective plate 1 side surface of the display panel 2, and are emitted to the outside as reflected light R3. The reflectance is about 1.4% if the second antireflection layer 42 is an LR film. Since the reflectance here is 1.4% with respect to the remaining light 96−1.3=95%, the intensity of the reflected light R2 on the display panel 2 side surface of the protective plate 1 is 95×0.014=1.3%, and this light is directly emitted to the outside.

Light other than the light reflected as reflected light R3 travels inside the display device, and passes through the second polarizer 32, but unlike Embodiment 1, a further antireflection effect for the reflected light R4 is not obtained, since the first polarizer does not exist.

In Reference Example 2, the total quantity of light (R1+R2+R3) emitted to the outside after reflected on the surfaces of the protective plate 1 and the display panel 2 is 4.0%+1.3%+1.3%=6.6%, when the intensity of incident light is 100%.

Table 1 shows all data of reflection (R1, R2) on the surface of the protective plate, reflection (R3) on the surface of the display panel, and the total quantity of light which is emitted to the outside (Total) of Embodiments 1 to 4 and Reference Examples 1 and 2. Each numeric value is a percentage when the intensity of incident light is 100%.

TABLE 1

|  | R1 | R2 | R3 | Total |
|---|---|---|---|---|
| Embodiment 1 (polarizer and two antireflection layers) | 4.0 | 0.48 | 0.47 | 5.0 |
| Embodiment 2 (polarizer and no antireflection layer) | 4.0 | 1.4 | 1.3 | 6.7 |
| Embodiment 3 (polarizer and one antireflection layer) | 4.0 | 0.48 | 1.4 | 5.9 |
| Embodiment 4 (polarizer and three antireflection layers) | 1.4 | 0.50 | 0.48 | 2.4 |
| Reference Example 1 (no polarizer and no antireflection layer) | 4.0 | 3.8 | 3.7 | 12 |
| Reference Example 2 (no polarizer and two antireflection layers) | 4.0 | 1.3 | 1.3 | 6.6 |

Comparing the display device of Reference Example 1 with the display devices of Embodiments 1 to 4, the total quantity of light which is emitted to the outside as reflected light is completely different, showing that a high antireflection effect can be obtained simply by adding one polarizer.

Comparing the display device of Reference Example 2 with the display device of Embodiment 2, it is shown that an effect equivalent to the case of disposing two antireflection layers can be obtained simply by adding one polarizer. According to the configuration of the present invention, a polarizer having a same specification as the polarizer of the liquid crystal display panel (second polarizer) can be used as the polarizer for antireflection (first polarizer), so fabrication is easier than the case of disposing two antireflection layers, and a structure having a high antireflection effect can be fabricated efficiently.

Furthermore as Embodiments 1 to 4 show, if the protective plate has a first polarizer for antireflection, the antireflection effect can be increased as a number of antireflection layers is increased.

As a result of an evaluation test for the configurations of the display devices of Embodiment 1 and Reference Example 2, the transmitted light intensity of the light, which is from backlight after having passed through the liquid crystal layer, is 185 cd/cm², whereas 210 cd/cm² in the case of the display device of Reference Example 2. In this way, according to the display device of Embodiment 1 (also Embodiments 2 to 4), transmittance of the light from the backlight drops to about 88% compared with Reference Example 2 (also Reference Example 1) because one polarizer is added, but the outer light reflection decreases almost 50% compared with Reference Example 1, so display quality as a whole improves dramatically.

As described above, according to the display devices of Embodiments 1 to 4, the display panel is protected from scratches, contamination and external impact by adding a protective plate to the surface of the display panel, and a high antireflection effect can be obtained simply by adding a polarizer, having a polarization axis the same as the polarizer which originally belonged to the liquid crystal display device, to the protective plate. Also by disposing the antireflection layer, an additional antireflection effect can be obtained without mutual interference.

Embodiment 5

Figure 7:
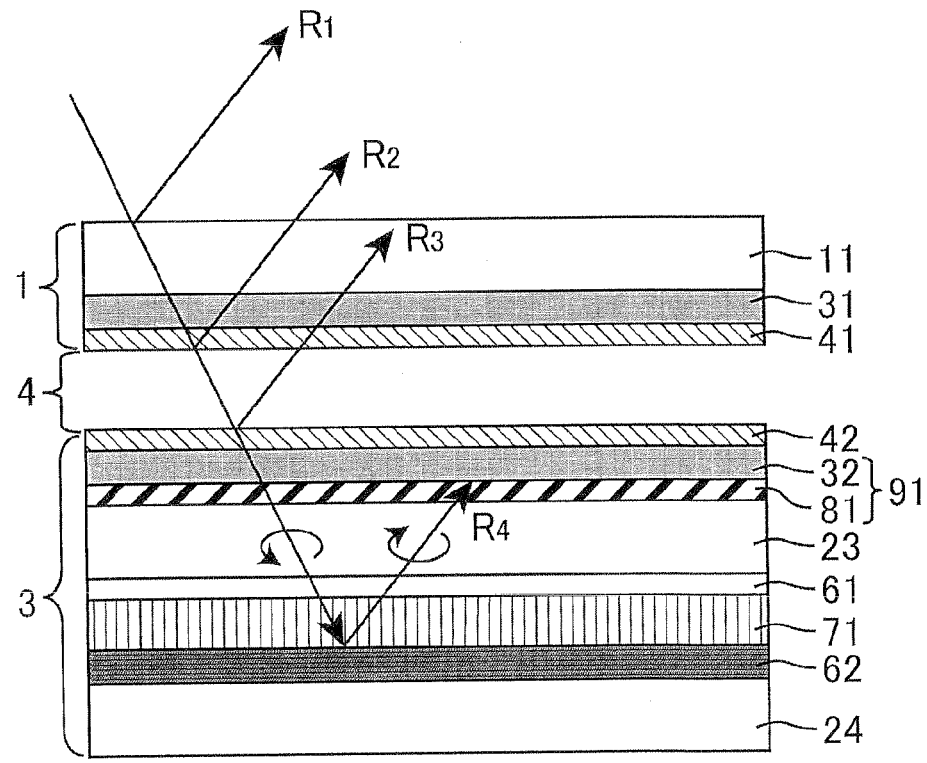
FIG. 7 is a cross-sectional view schematically depicting a configuration of a display device of Embodiment 5.
Figure 8:
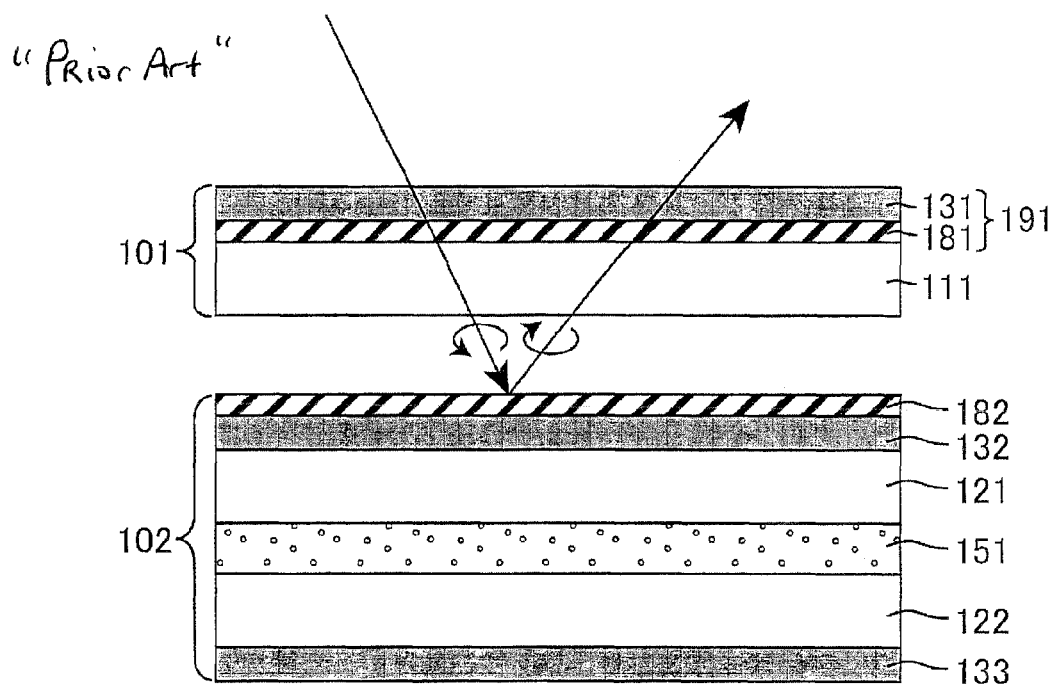
FIG. 8 is a cross-sectional view schematically depicting a configuration of a conventional liquid crystal display device when a configuration of a circularly polarizing plate is disposed for a protective plate.

FIG. 7 is a cross-sectional view schematically depicting a configuration of a display device of Embodiment 5. As FIG. 7 shows, the display device of Embodiment 5 has a display panel 3 and a protective plate 1 which is disposed facing the display panel 3, and the display panel 3 and the protective plate 1 are disposed in this order toward the display surface side (observation surface side). The configuration of the protective plate 1 is the same as Embodiment 1, and includes a protective base material 11 and the first polarizer 31, but a difference from Embodiment 1 is that the display panel 3 is not a liquid crystal display panel, but an organic EL display (OLED) panel.

The display panel 3 has a second support substrate 24, a reflective electrode 62, an organic EL layer 71, a transparent electrode 61, a first support substrate 23, a λ/4 plate 81, and a second polarizer 32 in this order toward the protective plate 1 side. The λ/4 plate 81 and the second polarizer 32 are superposed, so that the λ/4 plate 81 and the second polarizer 32 serve as a circularly polarizing plate. By disposing the circularly polarizing plate 91 in the display panel 3, the light traveling in the display panel 3 is converted into circularly polarized light by passing through the circularly polarizing plate 91. Light R4 reflected by the reflective electrode 62, which is the circularly polarized light in reverse rotation, is blocked by the same circularly polarizing plate 91. Thereby most of the components of the light $R_4$ reflected in the display panel 3 are not emitted to the outside.

Just like Embodiment 1, the axis direction of the polarization axis of the polarizer (first polarizer) 31 of the protective plate 1 and the axis direction of the polarization axis of the polarizer on the observation surface side (second polarizer) 32 of the display panel 3 are matched, and the polarization axes are parallel to each other. In Embodiment 5 as well, a layer which disturbs the phase difference of the transmitted light, such as the λ/4 plate, is not formed between the first polarizer 31 and the second polarizer 32, therefore the light that passes between the first polarizer 31 and the second polarizer 32 can be linearly polarized light, and light that has passed through the second polarizer 32 can directly pass through the first polarizer 31, and as a result, light for the display can be caused to pass through without dropping transmittance significantly.

A first antireflection layer 41 is formed on the display panel 3 side surface of the first polarizer 31, and a second antireflection layer 42 is formed on the protective plate 1 side surface of the second polarizer 32. Thereby the reflection of light on the surfaces of the protective plate 1 and the display panel 3 can be prevented. The types of antireflection layers 41 and 42 that can be used are the same as Embodiment 1.

The protective plate 1 and the display panel 3 are not directly contacted, but a predetermined space (air layer) 4 is created between the protective plate 1 and the display panel 3. By creating this predetermined space, the basic design is not affected very much, even if the protective plate 1 is warped by heat, and direct impact on the display panel 3 can be mitigated even if the protective plate 1 is subject to impact from the outside. Furthermore rework becomes easier when rework is required. However creating a predetermined space like this generates an interface of different refractive indexes between the protective plate 1 and the air layer 4, and between the display panel 3 and the air layer 4, and reflection tends to be generated on this interface. But according to the configuration of the present invention, degradation of display quality is suppressed even if this predetermined space is created, since means for reducing the quantity of reflected light generated on the interface is provided.

For the λ/4 plate 81, a film made from a polyvinyl alcohol, norbornane resin, a cellulose resin, a polycarbonate or the like, of which optical axis is adjusted to have a 100 to 175 nm phase difference, can be used.

For the first support substrate 23 and the second support substrate 24, an insulating substrate made from such organic material as glass and quartz, such plastic as polyethylene terephthalate, or such ceramic as alumina, can be used. Various lines and TFTs for driving pixels may be disposed on the second support substrate 24.

For the transparent electrode 61, a metal oxide having transparence, such as ITO and IZO, can be used. For the reflective electrode 62, a single layer of aluminum (Al), calcium (Ca), cesium (Cs), barium (Ba), magnesium (Mg) or silver (Ag), or a stacked product thereof, can be used. Each transparent electrode 61 is disposed in a matrix so as to constitute a pixel, whereby high definition display control can be performed. In the present embodiment, the transparent electrode 61 is an anode and the reflective electrode 62 is a cathode, that is, the present embodiment has a so called "bottom cathode" configuration.

For the organic EL layer 71, not only an emissive layer in which emitting material is filled, but one or all of a hole transporting layer, hole injection layer, electron transporting layer and electron injection layer may be included, and these layers may be a single layer structure or a stacked structure. Examples of the materials of the emissive layer include: poly (2-decyloxy-1,4-phenylene) DO-PPP,
poly[2,5-bis-[2-(N,N,N-triethyl ammonium)ethoxy]-1,4-phenyl-alto-1,4-phenylene]dibromide (PPP-NEt3+),
poly[2-(2'-ethyl hexyl oxy)-5-methoxy-1,4-phenylene vinylene] (MEH-PPV),
poly[5-methoxy-(2-propanoxy-sulfonid)-1,4-phenylene vinylene] (MPS-PPV),
poly[2,5-bis-(hexyloxy)-1,4-phenylene-(1-cyano-vinylene)] (CN-PPV), poly(9,9-dioctyl-fluorene) (PDAF), and polyspiro (PS).

The organic EL display device of Embodiment 5 has one polarizer on the protective plate 1, and one layer of antireflection layer on the protective plate 1 and the display panel 3 respectively, so the degree of antireflection effect to be obtained is the same as Embodiment 1. Therefore the total quantity of light ($R_1+R_2+R_3$) emitted to the outside after reflected on the surfaces of the protective plate 1 and the display panel 3, according to Embodiment 5, is 4.0%+0.48%+0.47%≅5.0% when the intensity of incident light is 100%. The white brightness of the organic EL display drops about 14%, compared with the case of not disposing the first polarizer on the protective plate.

As described above, according to the display device of Embodiment 5, the display panel is protected from scratches, contamination and external impact by adding a protective plate on the surface of the display panel, and a high antireflection effect can be obtained simply by adding a polarizer, which has a polarization axis the same as the polarizer which originally belonged to the organic EL display device, to the protective plate, and furthermore, an additional antireflection effect can be obtained without mutual interference by disposing an antireflection layer.

The present application claims priority under the Paris Convention and the laws of transient countries based on Japanese Patent Application No 2008-246107 filed on Sep. 25, 2008. The entirety of the content of the file is integrated into this application as reference.

EXPLANATION OF REFERENCE NUMERALS 1 protective plate
2 display panel (LCD panel)
3 display panel (OLED panel)
4 air layer
11 protective base material
21 first substrate (color filter substrate)
22 second substrate (active matrix substrate)
23 first support substrate
24 second support substrate
31 first polarizer
32 second polarizer
33 third polarizer
41 first antireflection layer
42 second antireflection layer
43 third antireflection layer
51, 151 liquid crystal layer
61 transparent electrode
62 reflective electrode
71 organic EL layer
81 λ/4 plate
101 touch panel with circularly polarizing plate
102 liquid crystal panel
111 touch panel
121 lower substrate
122 upper substrate
131 polarizer
132 upper polarizer
133 lower polarizer
181 λ/4 plate of touch panel with circularly polarizing plate
182 λ/4 plate having optical axis in direction orthogonal to optical axis of λ/4 plate of touch panel with circularly polarizing plate
91, 191 circularly polarizing plate

The invention claimed is:
1. A display device, comprising:
a display panel; and
a protective plate disposed facing the display panel,
wherein the protective plate comprises a protective base material and a first polarizer,
wherein the display panel comprises a second polarizer of which a polarization axis is parallel to that of the first polarizer,
light passing between the first polarizer and the second polarizer is linearly polarized light, and
nothing to substantially convert a light polarization state is disposed between the first polarizer and the second polarizer.
2. The display device according to claim 1, wherein an air layer is disposed between the display panel and the protective plate.
3. The display device according to claim 1, wherein the first polarizer is disposed on the display panel side of the protective base material.

4. The display device according to claim 1, wherein the protective plate further comprises a first antireflection layer on the display panel side surface of the protective plate.

5. The display device according to claim 1, wherein the display panel further comprises a second antireflection layer on the protective plate side surface of the display panel.

6. The display device according to claim 1, wherein the protective plate further comprises a third antireflection layer on the surface, facing the outside, of the protective plate.

7. The display device according to claim 1, wherein the display panel has a third polarizer, a first substrate, a liquid crystal layer, a second substrate, and the second polarizer, in this order toward the protective plate.

8. The display device according to claim 1, wherein the display panel has a first electrode, an organic electroluminescence layer, a second electrode, a $\lambda/4$ plate, and the second polarizer, in this order toward the protective plate.

* * * * *